(12) United States Patent
Park et al.

(10) Patent No.: US 8,507,917 B2
(45) Date of Patent: Aug. 13, 2013

(54) THIN FILM TRANSISTOR, METHOD FOR MANUFACTURING THE SAME, AND DISPLAY DEVICE USING THE SAME

(75) Inventors: Byoung-Keon Park, Yongin (KR); Jin-Wook Seo, Yongin (KR); Ki-Yong Lee, Yongin (KR); Dong-Hyun Lee, Yongin (KR); Kil-Won Lee, Yongin (KR); Jong-Ryuk Park, Yongin (KR); Yun-Mo Chung, Yongin (KR); Tak-Young Lee, Yongin (KR); Byung-Soo So, Yongin (KR); Min-Jae Jeong, Yongin (KR); Seung-Kyu Park, Yongin (KR); Yong-Duck Son, Yongin (KR); Jae-Wan Jung, Yongin (KR)

(73) Assignee: Samsung Display Co., Ltd., Yongin, Gyeongg-Do (KR)

( * ) Notice: Subject to any disclaimer, the term of this patent is extended or adjusted under 35 U.S.C. 154(b) by 90 days.

(21) Appl. No.: 13/209,617

(22) Filed: Aug. 15, 2011

(65) Prior Publication Data

US 2012/0056189 A1    Mar. 8, 2012

(30) Foreign Application Priority Data

Sep. 3, 2010   (KR) .......................... 10-2010-0086577

(51) Int. Cl.
*H01L 21/322*   (2006.01)
(52) U.S. Cl.
USPC .............................. 257/72; 257/913; 438/476

(58) Field of Classification Search
USPC ........................................ 438/143, 402, 471
See application file for complete search history.

(56) References Cited

U.S. PATENT DOCUMENTS

| | | | |
|---|---|---|---|
| 6,337,259 B1 * | 1/2002 | Ueda et al. | 438/471 |
| 6,436,745 B1 * | 8/2002 | Gotou et al. | 438/166 |
| 7,141,491 B2 | 11/2006 | Yamazaki et al. | |
| 8,227,299 B2 * | 7/2012 | Simoen et al. | 438/143 |
| 2004/0053485 A1 * | 3/2004 | Chen et al. | 438/586 |

FOREIGN PATENT DOCUMENTS

| | | |
|---|---|---|
| JP | 07-192998 A | 7/1995 |
| JP | 09-312404 A | 12/1997 |
| KR | 10-2001-0039624 A | 5/2001 |
| KR | 10-2003-0073076 A | 9/2003 |
| KR | 10-2006-0012850 A | 2/2006 |
| KR | 10-2008-0105563 A | 12/2008 |
| KR | 10-2008-0111693 A | 12/2008 |
| KR | 10-2009-0020287 A | 2/2009 |

* cited by examiner

Primary Examiner — Benjamin Sandvik
(74) Attorney, Agent, or Firm — Lee & Morse, P.C.

(57) ABSTRACT

A thin film transistor includes a substrate, a semiconductor layer provided on the substrate and crystallized by using a metal catalyst, a gate electrode insulated from and disposed on the semiconductor layer, and a getter layer disposed between the semiconductor layer and the gate electrode and formed with a metal oxide having a diffusion coefficient that is less than that of the metal catalyst in the semiconductor layer.

31 Claims, 17 Drawing Sheets

THIN FILM TRANSISTOR, METHOD FOR MANUFACTURING THE SAME, AND DISPLAY DEVICE USING THE SAME

BACKGROUND

1. Field

The described technology relates generally to a thin film transistor, a manufacturing method thereof, and a display device having the same. More particularly, the described technology relates generally to a thin film transistor including a polysilicon layer crystallized by use of a metal catalyst, a manufacturing method thereof, and a display device having the same.

2. Description of the Related Art

Most flat panel display devices, such as an organic light emitting diode (OLED) display, a liquid crystal display (LCD), and the like, include a thin film transistor. Particularly, a low temperature polycrystalline silicon thin film transistor (LTPS TFT) having good carrier mobility can be applicable to a high speed operational circuit and can be used for a CMOS circuit, so the LPTS TFT has been commonly used.

The LTPS TFT includes a polycrystalline silicon film that is formed by crystallizing an amorphous silicon film.

The above information disclosed in this Background section is only for enhancement of understanding of the background of the described technology and therefore it may contain information that does not form the prior art that is already known in this country to a person of ordinary skill in the art.

SUMMARY

An exemplary embodiment provides a thin film transistor including a substrate, a semiconductor layer provided on the substrate and crystallized by using a metal catalyst, a gate electrode insulated from and disposed on the semiconductor layer, a getter layer disposed between the semiconductor layer and the gate electrode, and formed with a metal oxide having a diffusion coefficient that is less than a diffusion coefficient of the metal catalyst in the semiconductor layer.

The diffusion coefficient of the getter layer may be greater than 0 less than 1/100 of the diffusion coefficient of the metal catalyst.

The thin film transistor may further include a buffer layer disposed between the substrate and the semiconductor layer. The metal catalyst may be scattered between the buffer layer and the semiconductor layer with a surface density in a range from 1.0e12 atoms/cm$^2$ to 1.0e15 atoms/cm$^2$.

The metal catalyst may be scattered on the semiconductor layer with a surface density in a range from 1.0e12 atoms/cm$^2$ to 1.0e15 atoms/cm$^2$.

The metal catalyst may include at least one of nickel (Ni), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt).

The getter layer may include at least one of scandium (Sc), titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), ruthenium (Ru), osmium (Os), cobalt (Co), rhodium (Rh), iridium (Ir), platinum (Pt), yttrium (Y), lanthanum (La), germanium (Ge), praseodymium (Pr), neodymium (Nd), dysprosium (Dy), holmium (Ho), aluminum (Al), titanium nitride (TiN), and tantalum nitride (TaN), alloys thereof, or silicides thereof.

The thin film transistor may further include a gate insulating layer disposed between the getter layer and the semiconductor layer.

The thin film transistor may further include an interlayer insulating layer that covers the gate electrode, a source electrode formed on the interlayer insulating layer, and a drain electrode formed on the interlayer insulating layer and spaced apart from the source electrode.

A plurality of contact holes may extend through the interlayer insulating layer, the getter layer, and the gate insulating layer to expose respective portions of the semiconductor layer, and the source electrode and the drain electrode contact the respective portions of the semiconductor layer through respective contact holes.

The thin film transistor may further include a gate insulating layer disposed between the getter layer and the semiconductor layer, the gate insulating layer being patterned with the semiconductor layer, and the getter layer may contact a side of the semiconductor layer.

The thin film transistor may further include a gate insulating layer disposed between the getter layer and the gate electrode. The getter layer may contact the semiconductor layer, and the getter layer and the semiconductor layer may have a same pattern.

An exemplary embodiment provides a method for manufacturing a thin film transistor including providing a substrate, forming an amorphous silicon layer on the substrate, forming a polysilicon layer by crystallizing the amorphous silicon layer by use of a metal catalyst, forming a semiconductor layer by patterning the polysilicon layer, the semiconductor layer including a residual amount of the metal catalyst, forming a gate insulating layer on the semiconductor layer, forming a plurality of gettering holes on the gate insulating layer, forming a gettering metal layer on the gate insulating layer to contact the semiconductor layer through the plurality of gettering holes, and forming a getter layer while oxidizing the gettering metal layer through a heat treatment process, and reducing a density of the metal catalyst included in the semiconductor layer.

The method may further include forming a gate electrode on the getter layer so as to overlap a region of the semiconductor layer, forming an interlayer insulating layer that covers the gate electrode, forming a plurality of contact holes penetrating the interlayer insulating layer, the getter layer, and the gate insulating layer and exposing source and drain portions of the semiconductor layer, and forming a source electrode and a drain electrode on the interlayer insulating layer to contact the semiconductor layer through the plurality of contact holes.

The plurality of contact holes may overlap the plurality of gettering holes.

When the plurality of contact holes are formed, portions of the getter layer contacting the semiconductor layer through the plurality of gettering holes may be eliminated.

An exemplary embodiment provides a method for manufacturing a thin film transistor including providing a substrate, forming an amorphous silicon layer on the substrate, forming a polysilicon layer by crystallizing the amorphous silicon layer by use of a metal catalyst, coating an insulation material on the polysilicon layer, forming a semiconductor layer and a gate insulating layer in the same pattern by patterning the polysilicon layer and the insulation material, forming a gettering metal layer on the gate insulating layer to contact a side of the semiconductor layer, and forming a getter layer by oxidizing the gettering metal layer through a heat treatment process, and reducing a density of metal catalyst included in the semiconductor layer.

An exemplary embodiment provides a method for manufacturing a thin film transistor including providing a substrate, forming an amorphous silicon layer on the substrate, forming a polysilicon layer by crystallizing the amorphous silicon layer by use of a metal catalyst, forming a gettering metal layer on the polysilicon layer, oxidizing the gettering metal layer through a heat treatment process, and reducing a density of metal catalyst included in the semiconductor layer, forming a semiconductor layer and a getter layer in the same pattern by patterning the polysilicon layer and the oxidized gettering metal layer, and forming a gate insulating layer on the getter layer.

The getter layer may be formed with a metal oxide having a diffusion coefficient that is less than a diffusion coefficient of the metal catalyst in the semiconductor layer.

The diffusion coefficient of the getter layer may be greater than 0 and less than 1/100 of the diffusion coefficient of the metal catalyst.

The method may further include forming a buffer layer between the substrate and the amorphous silicon layer. The metal catalyst may be scattered between the buffer layer and the amorphous silicon layer with a surface density in a range from $1.0e12$ atoms/cm$^2$ to $1.0e15$ atoms/cm$^2$.

The metal catalyst may be scattered on the amorphous silicon layer with a surface density in a range from $1.0e12$ atoms/cm$^2$ to $1.0e15$ atoms/cm$^2$.

The metal catalyst may include at least one of nickel (Ni), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt).

The getter layer may include at least one of scandium (Sc), titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), ruthenium (Ru), osmium (Os), cobalt (Co), rhodium (Rh), iridium (Ir), platinum (Pt), yttrium (Y), lanthanum (La), germanium (Ge), praseodymium (Pr), neodymium (Nd), dysprosium (Dy), holmium (Ho), aluminum (Al), titanium nitride (TiN), and tantalum nitride (TaN), alloys thereof, or silicides thereof.

The heat treatment process may be performed at a temperature from 400 to 993 degrees Celsius.

An exemplary embodiment provides a display device including a substrate, a semiconductor layer provided on the substrate and crystallized by using a metal catalyst, a gate electrode insulated from and disposed on the semiconductor layer, a getter layer disposed between the semiconductor layer and the gate electrode and formed with a metal oxide having a diffusion coefficient that is less than a diffusion coefficient of the metal catalyst in the semiconductor layer, a source electrode contacting a source region of the semiconductor layer and spaced apart from the gate electrode, and a drain electrode contacting a drain region of the semiconductor layer and spaced apart from the gate electrode and the source electrode.

The display device may further include a gate insulating layer disposed between the getter layer and the semiconductor layer.

The display device may further include an interlayer insulating layer that covers the gate electrode, wherein the source electrode is formed on the interlayer insulating layer, and the drain electrode is formed on the interlayer insulating layer and spaced apart from the source electrode.

A plurality of contact holes may extend through the interlayer insulating layer, the getter layer, and the gate insulating layer have to expose portions of the semiconductor layer. The source electrode and the drain electrode may contact the portions of the semiconductor layer through the contact holes.

The display device may further include a gate insulating layer disposed between the getter layer and the semiconductor layer, the gate insulating layer being patterned in a same pattern as the semiconductor layer. The getter layer may contact a side of the semiconductor layer.

The display device may further include a gate insulating layer disposed between the getter layer and the gate electrode. The getter layer may contact the semiconductor layer and the getter layer and the semiconductor layer may have a same pattern.

The display device may further include an organic light emitting diode connected to the drain electrode.

The display device may further include a pixel electrode connected to the drain electrode, a liquid crystal layer formed on the pixel electrode, and a common electrode formed on the liquid crystal layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
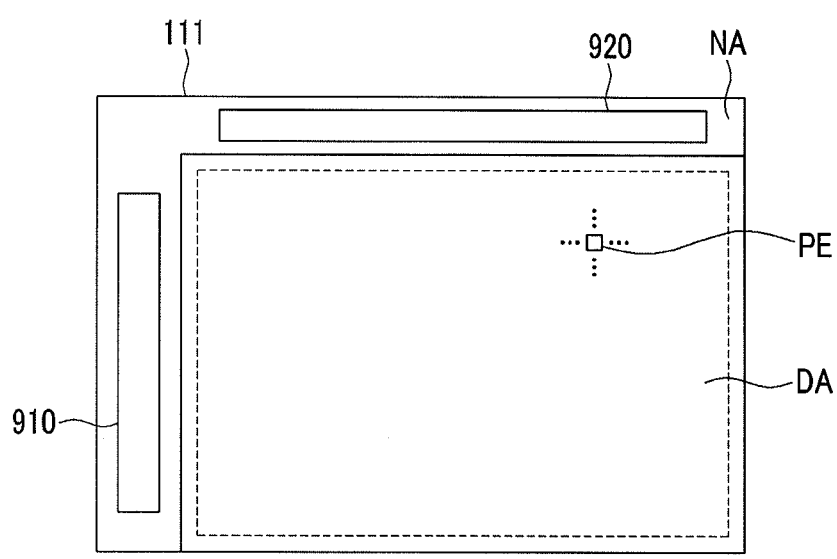
FIG. 1 illustrates a top plan view of a display device with a thin film transistor according to an exemplary embodiment.

Korean Patent Application No. 10-2010-0086577, filed on Sep. 3, 2010, in the Korean Intellectual Property Office, and entitled: "Thin Film Transistor, Method for Manufacturing the Same, and Display Device Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In addition, parts not related to the description are omitted for clear description of aspects of the present invention. Also, among several exemplary embodiments, exemplary embodiments other than the first exemplary embodiment may be described only with respect to components differing from those of the first exemplary embodiment.

A thin film transistor 11 according to exemplary embodiments and a display device 101 having the same will now be described with reference to FIG. 1 to FIG. 3.

As shown in FIG. 1, the display device 101 may include a substrate 111 divided into a display area (DA) and a non-display area (NA). A plurality of pixel areas (PEs) may be formed in the display area (DA) display images, and driving circuits 910 and 920 may be formed in the non-display area (NA). The pixel area (PE) represents an area in which a pixel for displaying an image is formed. However, as described above, both the driving circuits 910 and 920 do not need to be formed in the non-display area (NA), and one or both of them can be omitted.

Figure 2:
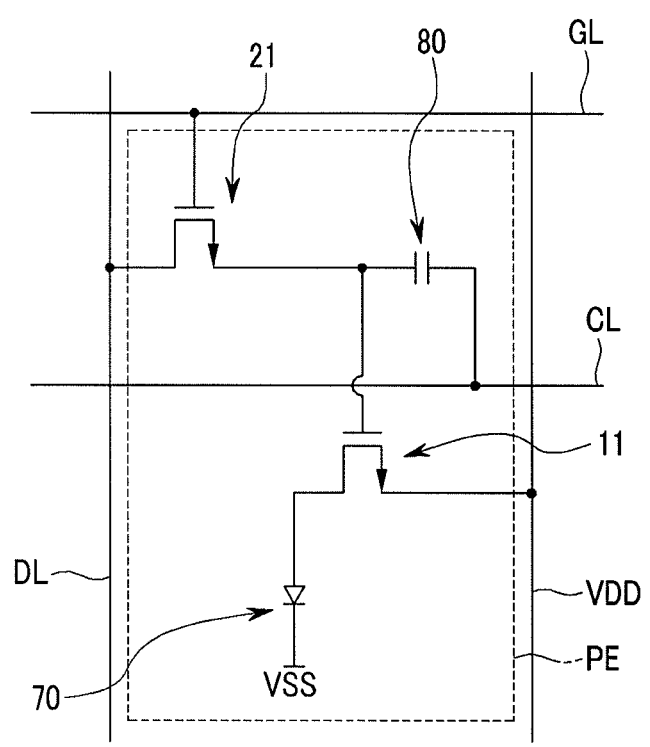
FIG. 2 illustrates a circuit diagram of a pixel circuit of a display device shown in FIG. 1.

As shown in FIG. 2, the display device 101 may represent an organic light emitting diode (OLED) display with the 2Tr-1Cap configuration including an organic light emitting diode 70, thin film transistors (TFTs) 11 and 21, and a capacitor 80 for each pixel area (PE). However, the display device is not restricted to the above-described configuration. Therefore, the display device 101 may represent an organic light emitting diode (OLED) display including three or more thin film transistors and at least two capacitors per pixel area (PE). Further, the display device 101 may be formed to have another configuration with additional wiring. Accordingly, at least one additionally formed thin film transistor and capacitor can configure a compensation circuit.

The compensation circuit may suppress generation of deviation of image quality by improving uniformity of the organic light emitting diode 70 formed in each pixel area (PE). In general, the compensation circuit may include 2 to 8 thin film transistors.

Also, the driving circuits 910 and 920 shown in FIG. 1 formed in the non-display area (NA) of the substrate 111 may include additional thin film transistors.

The organic light emitting diode 70 may include an anode electrode that is a hole injection electrode, a cathode electrode that is an electron injection electrode, and an organic emission layer disposed between the anode and the cathode.

In detail, the display device 101 may include a first thin film transistor 11 and a second thin film transistor 21 for each pixel area (PE). The first thin film transistor 11 and the second thin film transistor 21 may include a gate electrode, an active layer, a source electrode, and a drain electrode, respectively.

A gate line (GL), a data line (DL), and a common power line (VDD) are shown in FIG. 2 together with a capacitor line (CL), but the present invention is not restricted thereto. Hence, the capacitor line (CL) can be omitted depending on the case.

The data line (DL) may be connected to a source electrode of the second thin film transistor 21, and the gate line (GL) may be connected to a gate electrode of the second thin film transistor 21. A drain electrode of the second thin film transistor 21 may be connected to the capacitor line (CL) through a capacitor 80. A node may be formed between the drain electrode of the second thin film transistor 21 and the capacitor 80 and may be connected to a gate electrode of the first thin film transistor 11. The drain electrode of the first thin film transistor 11 may be connected to the common power line (VDD), and the source electrode thereof may be connected to the anode of the organic light emitting diode 70.

The second thin film transistor 21 may be used as a switch for selecting a pixel area (PE) to emit light. When the second thin film transistor 21 is turned on, the capacitor 80 is charged, and the charge amount in this case may be in proportion to a potential of a voltage applied from the data line (DL). When a signal with a voltage that is increased for each frame is input to the capacitor line (CL) while the second thin film transistor 21 is turned off, a gate potential of the first thin film transistor 11 may be increased according to a voltage level applied through the capacitor line (CL) based on the potential charged in the capacitor 80. The first thin film transistor 11 is turned on when the gate potential exceeds a threshold voltage. The voltage applied to the common power line VDD may be applied to the organic light emitting diode 70 through the first thin film transistor 110, and the organic light emitting diode 70 emits light.

The configuration of the pixel area (PE) is not restricted to the above description, and is changeable in various manners by a skilled person within the embodiment range of the present invention.

A configuration of a thin film transistor 11 according to an exemplary embodiment will now be described with reference to FIG. 3. The thin film transistor 11 may represent the first thin film transistor shown in FIG. 2. The second thin film transistor 21 shown in FIG. 2 may have the same configuration as the thin film transistor 11, or may have a different configuration.

The substrate 111 may be formed with a transparent and insulating substrate of glass, quartz, ceramic, or plastic. However, the substrate 111 is not restricted thereto, and the substrate 111 may also be formed as a metallic substrate of stainless steel. Also, when the substrate 111 is made of plastic, it may be formed to be a flexible substrate.

A buffer layer 120 may be formed on the substrate 111. The buffer layer 120 may be formed to be a single layer or multiple layers including at least one of a silicon oxide layer and a silicon nitride layer by using chemical vapor deposition or physical vapor deposition.

The buffer layer 120 may help crystallization of an amorphous silicon layer by preventing diffusion of moisture or impurities generated from the substrate 111 or by controlling the transmission speed of heat during crystallization.

A semiconductor layer 131 crystallized by use of a metal catalyst may be formed on the buffer layer 120. The semiconductor layer 131 may be formed by forming a polysilicon layer by crystallizing an amorphous silicon layer formed on the buffer layer 120, and then patterning the polysilicon layer. The metal catalyst is used to crystallize the amorphous silicon layer, and a residual amount of the metal catalyst may remain in the crystallized semiconductor layer 131.

In the present exemplary embodiment, a super grain silicon (SGS) crystallization method may be used. The SGS crystallization method controls the size of grains to be from several μm to several hundreds of μm by controlling the concentration of the metal catalyst that spreads to the amorphous silicon layer to be a low concentration. The metal catalyst is scattered with a low concentration so as to control the concentration of the metal catalyst that spreads to the amorphous silicon layer to be a low concentration.

The SGS crystallization method may crystallize the amorphous silicon layer within a relatively short time at a low temperature. For example, regarding the process for crystallizing the amorphous silicon layer by using nickel (Ni) as a metal catalyst, nickel (Ni) may be combined with silicon (Si) of the amorphous silicon layer to become nickel disilicide ($NiSi_2$). The nickel disilicide ($NiSi_2$) may act as a seed to grow the crystal.

Accordingly, the polysilicon layer crystallized through the metal catalyst may have a grain size of several tens of μm, which may be greater than that of the solid phase crystallized (SPC) polysilicon layer.

Also, in the case of the polysilicon layer formed by the SGS crystallization method, a plurality of sub-grain boundaries may exist in a single grain boundary, thereby minimizing deterioration of uniformity because of the grain boundary.

Further, the thin film transistor 11 using the polysilicon layer formed by the SGS crystallization method may have relatively high current driving performance, that is, electron mobility, but it may have a relatively high leakage current because of the metal catalyst remaining in the semiconductor layer 131. However, according to the present exemplary embodiment, the leakage current may be suppressed by reducing the amount of the metal catalyst remaining in the semiconductor layer 131.

In detail, the metal catalyst may be scattered with a surface density within the range from 1.0e12 $atoms/cm^2$ to 1.0e15 $atoms/cm^2$ on the buffer layer 120 before the amorphous silicon layer is formed on the buffer layer 120. The metal catalyst may be present between the buffer layer 120 and the amorphous silicon layer. A lesser amount of the metal catalyst may be scattered as molecules on the buffer layer 120. When the metal catalyst is formed to be less than the surface density of 1.0e12 $atoms/cm^2$, the amount of seeds, the kernels of crystallization, may be less, and it may be difficult for the amorphous silicon layer to be sufficiently crystallized as a polysilicon layer according to the SGS crystallization method. On the other hand, when the metal catalyst is formed to be greater than the surface density of 1.0e15 $atoms/cm^2$, the amount of the metal catalyst spread to the amorphous silicon layer may be increased to reduce the grains of the polysilicon layer and increase the amount of the metal catalyst remaining in the polysilicon layer. Therefore, the characteristic of the semiconductor layer 131 that is formed by patterning the polysilicon layer may be deteriorated.

The present exemplary embodiment is not restricted to the above description. The metal induced crystallization (MIC) method or the metal induced al crystallization (MILC) may also be used for the crystallization method using the metal catalyst.

The metal catalyst may be scattered not between the buffer layer 120 and the amorphous silicon layer but on top of the amorphous silicon layer. However, when the metal catalyst is disposed below the amorphous silicon layer to grow crystals, grain boundaries may become more vague and the defects within the grains may be further reduced compared to the case in which the metal catalyst is disposed above the amorphous silicon layer to grow the crystal.

The metal catalyst may include at least one of nickel (Ni), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt). For example, nickel (Ni) may be used as a metal catalyst.

Nickel disilicide ($NiSi_2$) generated by combination of nickel (Ni) and silicon (Si) may efficiently boost crystal growth.

A gate insulating layer 140 may be formed on the semiconductor layer 131. The gate insulating layer 140 may formed to cover the semiconductor layer 131 on the buffer layer 120. The gate insulating layer 140 may be include at least one insulation material such as tetraethylorthosilicate (TEOS), silicon nitride (SiNx), or silicon oxide ($SiO_2$).

A getter layer 135 may be formed on the gate insulating layer 140. The getter layer 135 may be formed with a metal oxide having a diffusion coefficient that is lower than that of the metal catalyst in the semiconductor layer 131. In detail, the diffusion coefficient of the getter layer 135 can be greater than 0 and less than $1/100$ of the diffusion coefficient of the metal catalyst.

When the diffusion coefficient of the getter layer 135 is equal to $1/100$ or less than $1/100$ of the metal catalyst, the getter layer 135 may efficiently getter the metal catalyst in the semiconductor layer 131.

Nickel as a metal catalyst has a diffusion coefficient that is $10^{-5}$ $cm^2/s$ or less in the semiconductor layer 131. Therefore, in the case of using nickel (Ni) for the metal catalyst, it may be efficient for the getter layer 135 to have a diffusion coefficient greater than 0 and less than $10^{-7}$ $cm^2/s$. Gettering metal used to form the getter layer 135 can be at least one of scandium (Sc), titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), ruthenium (Ru), osmium (Os), cobalt (Co), rhodium (Rh), iridium (Ir), and platinum (Pt). It can also be at least one of yttrium (Y), lanthanum (La), germanium (Ge), praseodymium Pr, neodymium (Nd), dysprosium (Dy), holmium (Ho), aluminum (Al), titanium nitride (TiN), and tantalum nitride (TaN). Also, alloys of the above-described metals or their silicides can be used for the gettering metal.

The getter layer 135 may be formed by forming a gettering metal layer using the gettering metal, and applying heat treatment to the gettering metal layer. When the gettering metal layer is heated, the gettering metal layer may be oxidized to become the getter layer 135. Also, during the heat treatment process, at least part of the metal catalyst in the semiconductor layer 131 may be removed by the getter layer 135.

Regarding the process for eliminating the metal catalyst in the semiconductor layer 131, at least part of the metal catalyst remaining in the semiconductor layer 131 may migrate to a portion of the semiconductor layer 131 touching the gettering metal layer as a result of the heat treatment process. In this instance, the metal catalyst may be precipitated on the gettering metal layer and may no longer migrate because it is thermodynamically more stable for the metal catalyst to remain in contact with the gettering metal layer than to remain in the semiconductor layer 131. Accordingly, at least part of the metal catalyst remaining in the semiconductor layer 131 may be removed.

Where the getter layer 135 meets the semiconductor layer 131 is not shown in FIG. 3 because this portion of the getter layer 135 is eliminated during the process for forming contact holes 166 and 167 to be described below. Since the portion of the getter layer 135 having contacted the semiconductor layer 131 is removed, deterioration of the characteristic of the thin film transistor 11 is more stably suppressed because less of the metal catalyst remains.

The getter layer 135 formed with the metal oxide may have a thickness within a range from several nm to several tens of nm. The getter layer 135 may function as an insulator to supplement the gate insulating layer 140. When the getter layer 135 has a thickness that is less than several nm, it may become difficult to efficiently remove the metal catalyst. On the other hand, when the getter layer 135 has a thickness that is greater than several tens of nm, thermal stress may be generated in the heat treatment process.

A gate electrode 151 may be formed on the getter layer 135. The gate electrode 151 may be disposed to be overlap a region of the semiconductor layer 131. The gate electrode 151 may include at least one of molybdenum (Mo), chromium (Cr), aluminum (Al), silver (Ag), titanium (Ti), tantalum (Ta), and tungsten (W).

An interlayer insulating layer 160 may be formed at the gate electrode 151. The interlayer insulating layer 160 may cover the gate electrode 151 over the getter layer 135. The interlayer insulating layer 160 may be formed of tetraethylorthosilicate (TEOS), silicon nitride (SiNx), or silicon oxide (SiOx), similar to the gate insulating layer 140, but is not limited thereto.

Contact holes 166 and 167 may extend through the interlayer insulating layer 160, the getter layer 135, and the gate insulating layer 140 to expose respective portions of the semiconductor layer 131.

A source electrode 176 and a drain electrode 177 contacting the semiconductor layer 131 may be formed on the interlayer insulating layer 160 through the respective contact holes 166 and 167. The source electrode 176 may be spaced apart from the drain electrode 177. Similar to the gate electrode 151, the source electrode 176 and the drain electrode 177 may include at least one of molybdenum (Mo), chromium (Cr), aluminum (Al), silver (Ag), titanium (Ti), tantalum (Ta), and tungsten (W).

According to the above-described configuration, the thin film transistor 11 may have the semiconductor layer 131 that may be crystallized at a low temperature and within a short time by using the metal catalyst, and the amount of the metal catalyst remaining in the semiconductor layer 131 may be efficiently reduced.

Also, the display device 101 may have the thin film transistor 11 with a semiconductor layer 131 in which an amount of the metal catalyst may have been effectively reduced.

A method for manufacturing a thin film transistor 11 according to an exemplary embodiment will now be described with reference to FIG. 4 to FIG. 10.

Figure 4:
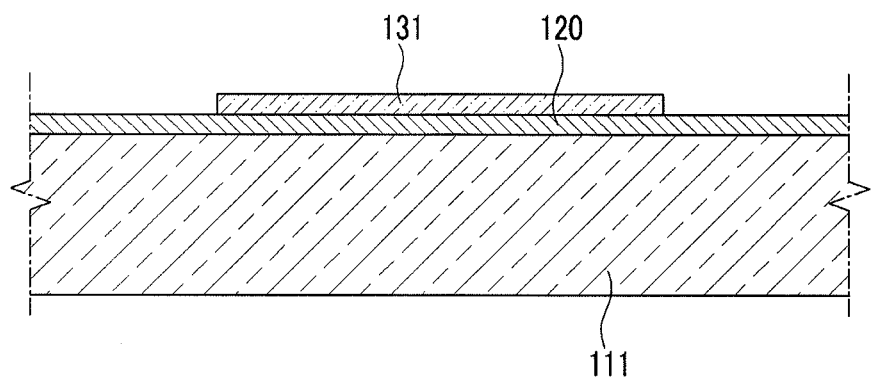
FIG. 4 to FIG. 8 illustrate sequential cross-sectional views of a manufacturing process for a thin film transistor as shown in FIG. 3.

First, as shown in FIG. 4, a buffer layer 120 may be formed on a substrate 111. The buffer layer 120 may be formed to be a single layer or multiple layers including at least one of a silicon oxide layer and a silicon nitride layer by using chemical vapor deposition or physical vapor deposition.

A metal catalyst may be scattered on the buffer layer 120 with a surface density within a range from $1.0e12$ atoms/cm$^2$ to $1.0e15$ atoms/cm$^2$. A lesser amount of the metal catalyst may be scattered as molecules on the buffer layer 120. For example, nickel may be used as the metal catalyst.

An amorphous silicon layer may be formed on the buffer layer 120. Also, when or after the amorphous silicon layer is formed, a de-hydrogenation process for lowering concentration of hydrogen may be performed. The amorphous silicon layer may be crystallized to form a polysilicon layer. When the amorphous silicon layer is heated, the metal catalyst (MC) that is scattered on the buffer layer 120 may initiate the growth of crystals. The metal catalyst may control the amorphous silicon layer to be crystallized within a relatively short time at a low temperature.

The present exemplary embodiment is not restricted to the above description. Therefore, the metal catalyst may be scattered directly onto the amorphous silicon layer instead of being scattered on the buffer layer 120.

A semiconductor layer 131 may be formed by patterning the crystallized polysilicon layer. In this instance, the metal catalyst used for crystallization may remains in the semiconductor layer 131.

Figure 5:
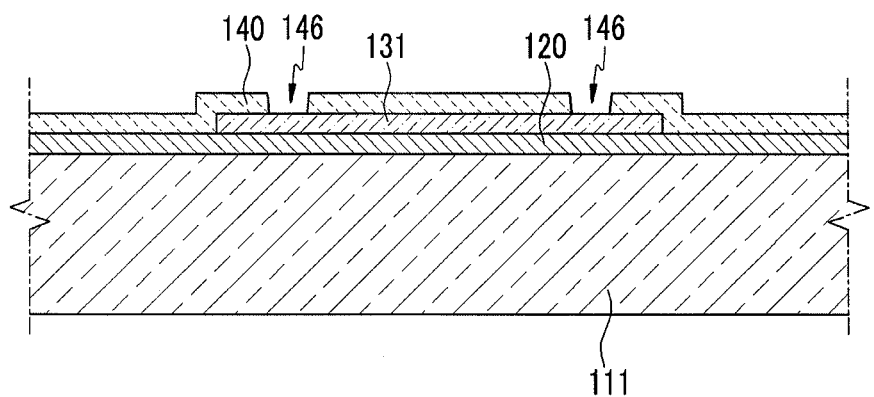

As shown in FIG. 5, a gate insulating layer 140 may be formed on the semiconductor layer 131. The gate insulating layer 140 may be patterned to form a plurality of gettering holes 146 and 147 that expose parts of the semiconductor layer 131.

Figure 6:
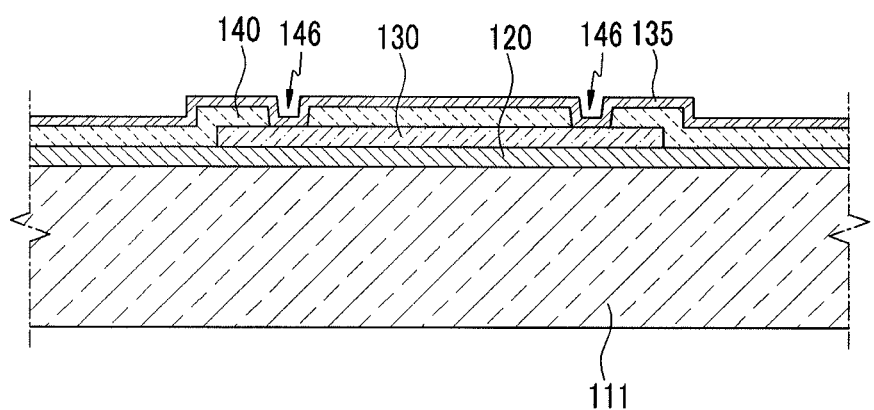

As shown in FIG. 6, a gettering metal layer may be formed on the gate insulating layer 140. The gettering metal layer may contact the semiconductor layer 131 through the plurality of gettering holes 146 and 147.

The gettering metal layer may be formed of a metal having a diffusion coefficient that is less than that of the metal catalyst in the semiconductor layer 131. In detail, when the diffusion coefficient of the gettering metal layer is equal to $\frac{1}{100}$ or less than $\frac{1}{100}$ of the diffusion coefficient of the metal catalyst, the metal catalyst in the semiconductor layer 131 can be efficiently removed.

A getter layer 135 is formed by oxidizing the gettering metal layer through a heat treatment process. The getter layer 135 may be formed with a metal oxide having a diffusion coefficient that is less than that of the metal catalyst in the semiconductor layer 131.

While the getter layer 135 is formed through the heat treatment process, the density of the metal catalyst included in the semiconductor layer 131 may be reduced. At least some of the metal catalyst remaining in the semiconductor layer 131 may be eliminated. During the heat treatment, at least some of the metal catalyst remaining in the semiconductor layer 131 migrates to portions of the semiconductor layer that touch the gettering metal layer. The metal catalyst that has migrated to the gettering metal layer may settle on the gettering metal layer and may no longer spread because it may be more stable for the metal catalyst to touch the gettering metal layer instead of being present within the semiconductor layer 131. The amount of the metal catalyst included in the semiconductor layer 131 may be reduced.

Also, the getter layer 135 may be formed with a thickness from several nm to several tens of nm.

Figure 7:
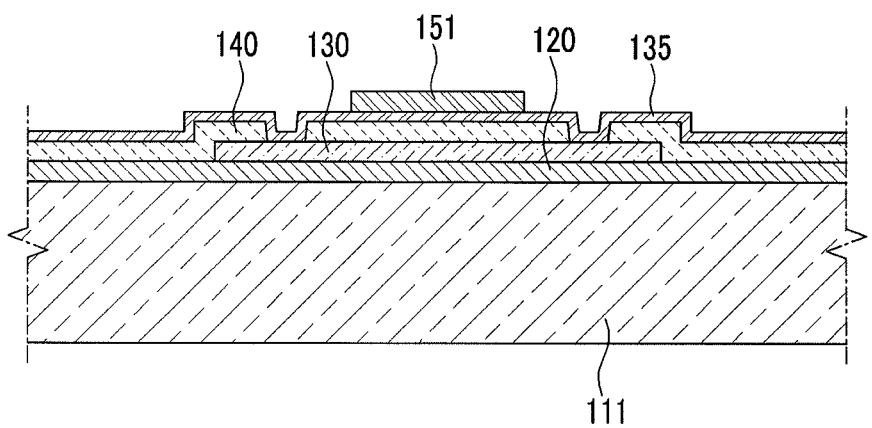

As shown in FIG. 7, a gate electrode 151 may be formed on the getter layer 135. The getter layer 135 may function as an insulator since it is formed with a metal oxide. The getter layer 135 may supplement the gate insulating layer 140.

Figure 8:
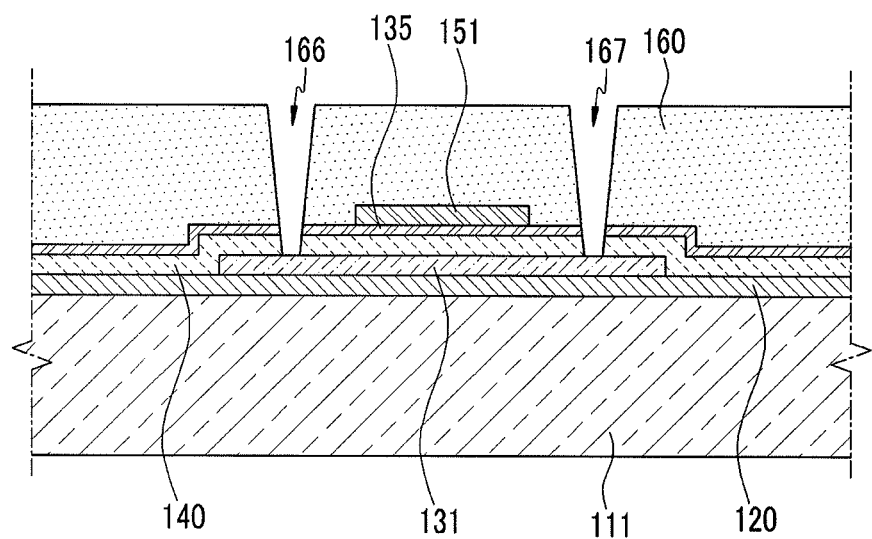

As shown in FIG. 8, an interlayer insulating layer 160 that covers the gate electrode 151 may be formed. Contact holes 166 and 167 penetrating the interlayer insulating layer 160, the getter layer 135, and the gate insulating layer 140 and exposing respective portions of the semiconductor layer 131 may be formed.

The contact holes 166 and 167 may overlap the gettering holes 146 and 147 shown in FIG. 6 formed in the gate insulating layer 140. The portion of the getter layer 135 contacting the semiconductor layer 131 through the gettering holes 146 and 147 may be eliminated when the contact holes 166 and 167 are formed.

Figure 3:
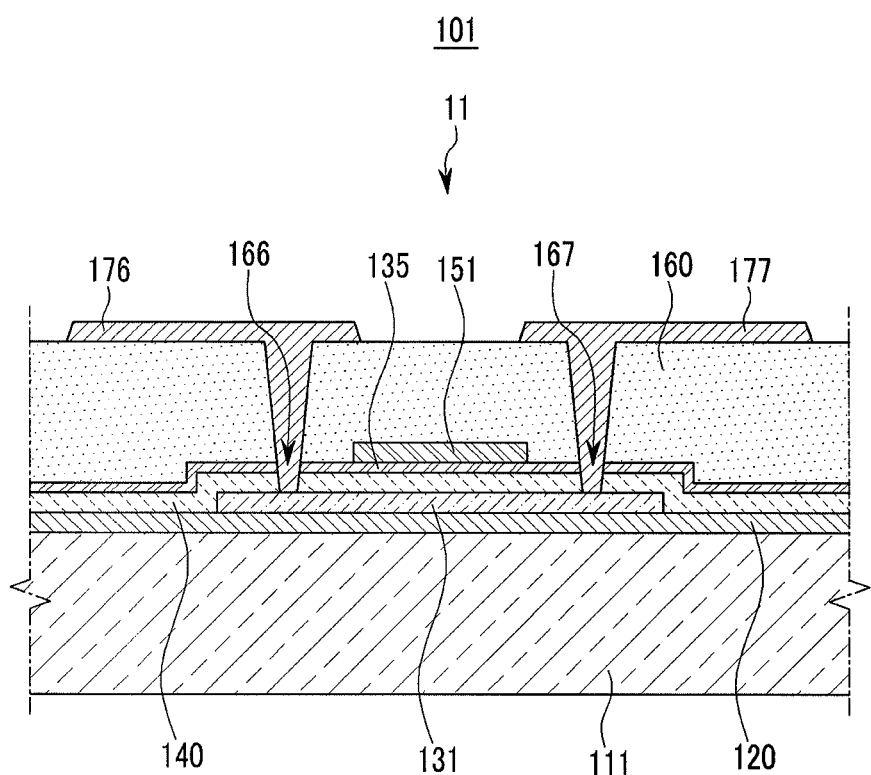
FIG. 3 illustrates a magnified cross-sectional view of a thin film transistor according to the exemplary embodiment.

As shown in FIG. 3, a source electrode 176 and a drain electrode 177 may be formed with a gap therebetween.

Through the above-described manufacturing method, the thin film transistor 11 according to the present exemplary embodiment can be manufactured. That is, the metal catalyst included in the semiconductor layer 131 may be be efficiently gettered.

A thin film transistor 12 according to another exemplary embodiment will now be described with reference to FIG. 9.

Figure 9:
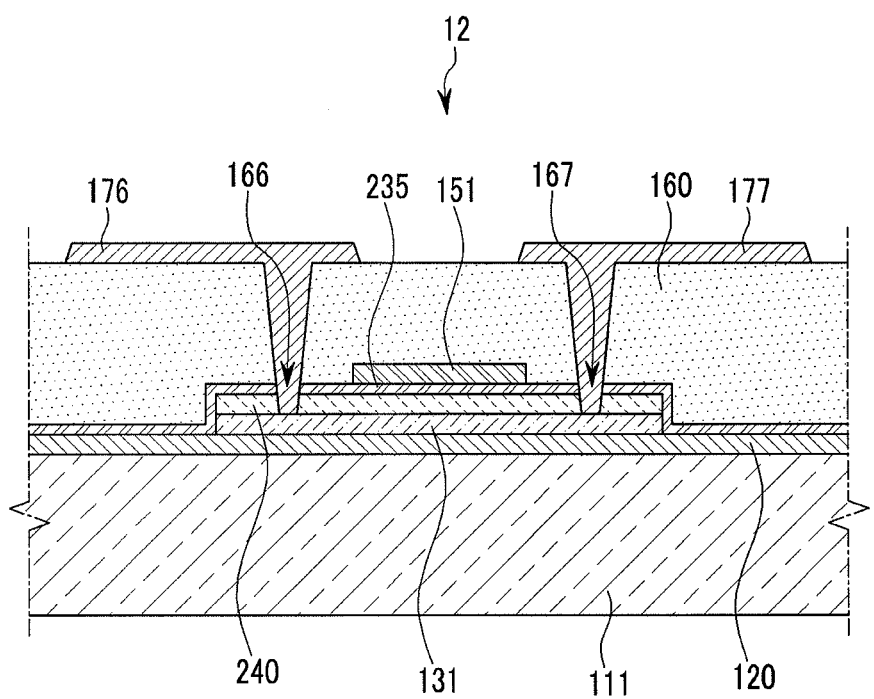
FIG. 9 illustrates a magnified cross-sectional view of a thin film transistor according to another exemplary embodiment.

As shown in FIG. 9, a buffer layer 120 may be formed on the substrate 111, and a semiconductor layer 131 crystallized by using the metal catalyst may be formed on the buffer layer 120. The metal catalyst may be used to crystallize the semiconductor layer 131, and part thereof may remain within the crystallized semiconductor layer.

A gate insulating layer 240 patterned with the semiconductor layer 131 may be formed on the semiconductor layer 131. The gate insulating layer 240 may be formed in the same pattern as the semiconductor layer 131 except for the contact holes 166 and 167 to be described below. That is, in the present exemplary embodiment, the gate insulating layer 240 is not formed directly on the buffer layer 120.

A getter layer 235 may be formed on the gate insulating layer 240. The getter layer 235 may be formed with a metal oxide having a diffusion coefficient that is less than that of the metal catalyst in the semiconductor layer 131. In the present exemplary embodiment, the getter layer 235 may be formed to cover the semiconductor layer 131 and the gate insulating layer 240 and may contact the buffer layer 120. In this instance, the getter layer 235 may be formed to contact a side of the semiconductor layer 131. The metal catalyst remaining in the semiconductor layer 131 may be eliminated where the getter layer 235 contacts the semiconductor layer 131.

Also, the getter layer 235 of the metal oxide may have a thickness from several nm to several tens of nm, and may function as an insulator to support the gate insulating layer 240.

A gate electrode 151 may be formed on the getter layer 235. The gate electrode 151 may be disposed to be overlap a region of the semiconductor layer 131.

An interlayer insulating layer 160 may be formed on the gate electrode 151. That is, the interlayer insulating layer 160 may cover the gate electrode 151 on the getter layer 235.

Contact holes 166 and 167 may extend through the interlayer insulating layer 160, the getter layer 235, and the gate insulating layer 240 to expose respective portions of the semiconductor layer 131.

A source electrode 176 and a drain electrode 177 contacting the semiconductor layer 131 may be formed through the contact holes 166 and 167 on the interlayer insulating layer 160. The source electrode 176 may be spaced apart from the drain electrode 177.

Through the above-described configuration, the thin film transistor 12 according to the present exemplary embodiment may have a semiconductor layer 131 that is quickly crystallized at a low temperature by using a metal catalyst and from which the amount of the metal catalyst is efficiently reduced.

Figure 10:
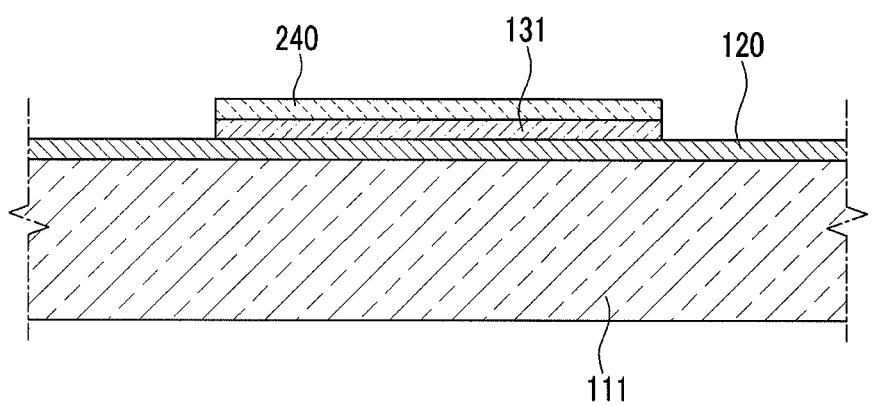
FIG. 10 to FIG. 12 illustrate sequential cross-sectional views of a manufacturing process for a thin film transistor as shown in FIG. 9.

A method for manufacturing a thin film transistor 12 according to the present exemplary embodiment will now be described with reference to FIG. 10 to FIG. 12.

A buffer layer 120 may be formed on the substrate 111, and a metal catalyst may be scattered on the buffer layer 120 with surface density from 1.0e12 atoms/cm$^2$ to 1.0e15 atoms/cm$^2$. For example, nickel may be used for the metal catalyst.

An amorphous silicon layer may be formed on the buffer layer 120, and a polysilicon layer may be formed by crystallizing the amorphous silicon layer by use of a metal catalyst. An insulation material may be deposited on the polysilicon layer, and as shown in FIG. 10, the polysilicon layer and the insulation material may be patterned to form a semiconductor layer 131 and a gate insulating layer 240. The semiconductor layer 131 and the gate insulating layer 240 may be formed to have the same pattern. The metal catalyst used for crystallization may remain in the semiconductor layer 131.

However, the method for manufacturing a thin film transistor 12 according to the present exemplary embodiment is not restricted to thereto. An insulation material may be deposited on the amorphous silicon layer, and the amorphous silicon layer may be crystallized while the insulation material is deposited. In this instance, the metal catalyst may migrate to the insulation material to reduce the metal catalyst remaining in the semiconductor layer 131.

Figure 11:
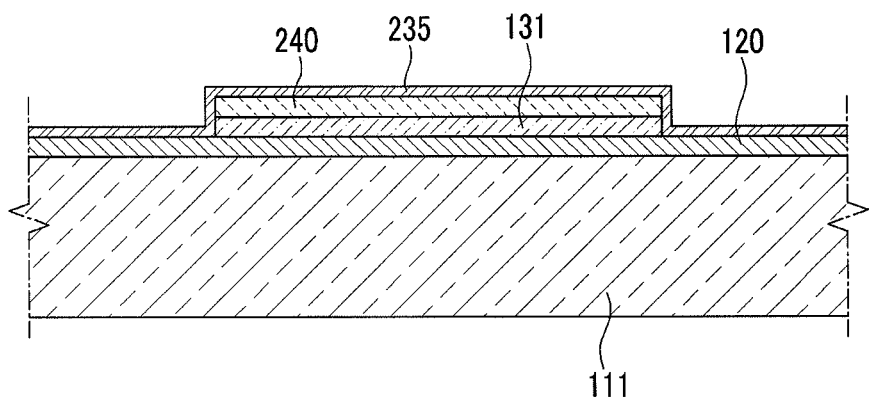

As shown in FIG. 11, a gettering metal layer may be formed to extend from the buffer layer 120 over the gate insulating layer 240. The gettering metal layer may contact one side of the semiconductor layer 131. The gettering metal layer may be formed with a metal having a diffusion coefficient that is less than that of the metal catalyst within the semiconductor layer 131.

A getter layer 235 may be formed by oxidizing the gettering metal layer through a heat treatment process. The getter layer 235 may be formed with a metal oxide having a diffusion coefficient that is less than that of the metal catalyst in the semiconductor layer 131.

The density of the metal catalyst included in the semiconductor layer 131 may be reduced while the getter layer 235 is formed through the heat treatment process. At least part of the metal catalyst in the semiconductor layer 131 may be eliminated. At least part of the metal catalyst remaining in the semiconductor layer 131 may migrate during the heat treatment process to the area of the semiconductor layer 131 contacting the gettering metal layer. The metal catalyst that has migrated to the gettering metal layer may settle in the gettering metal layer and may no longer migrate. Accordingly, at least part of the metal catalyst remaining in the semiconductor layer 131 may be eliminated.

Further, the getter layer 235 may be formed with a thickness from several nm to several tens of nm.

Figure 12:
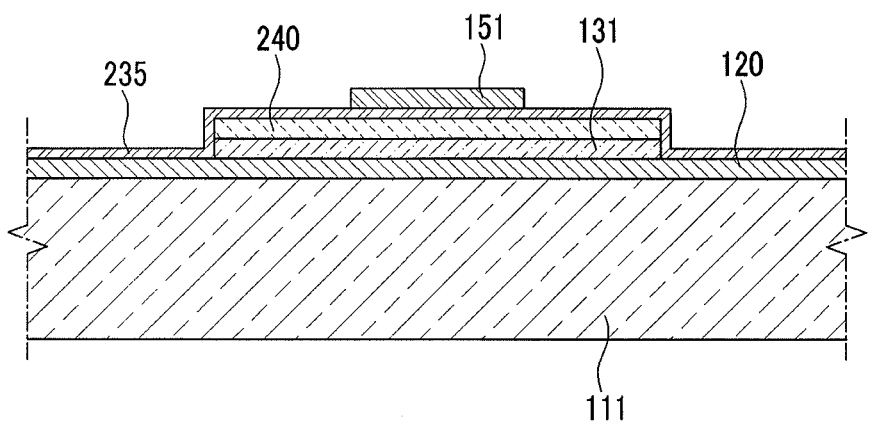

As shown in FIG. 12, a gate electrode 151 may be formed on the getter layer 235. The getter layer 235 may function as an insulator since it may be formed with a metal oxide. The getter layer 235 supplement the gate insulating layer 240.

As shown in FIG. 9, an interlayer insulating layer 160 that covers the gate electrode 151 may be formed. A source electrode 176 and a drain electrode 177 may be formed on the interlayer insulating layer 160. The source electrode 176 and the drain electrode 177 may be spaced apart from each other, and may contact the semiconductor layer 131 through the contact holes 166 and 167.

Through the above-described manufacturing method, the thin film transistor 12 according to the second exemplary embodiment may be manufactured. That is, the metal catalyst included in the semiconductor layer 131 may be efficiently gettered.

Figure 13:
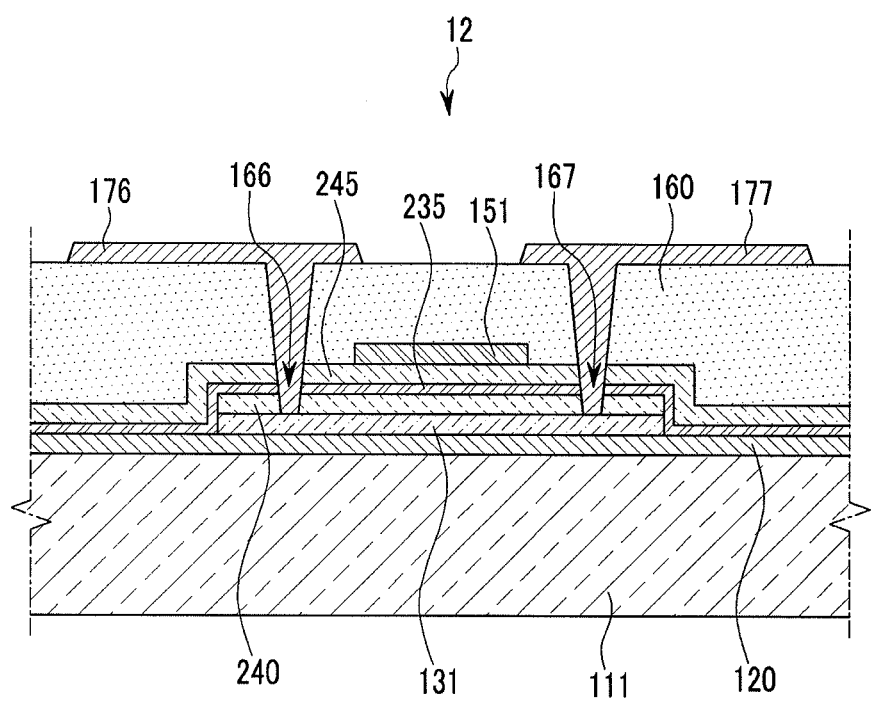
FIG. 13 illustrates a magnified cross-sectional view of a thin film transistor according to a modified exemplary embodiment.

FIG. 13 shows a thin film transistor 12 according to a modified exemplary embodiment.

As shown in FIG. 13, the thin film transistor 12 may further include an additional gate insulating layer 245 between the getter layer 235 and the gate electrode 151. Since the getter layer 235 may be formed with an oxidized metal, the problem that may occur when the metal is insufficiently oxidized and the getter layer 235 has conductivity may be prevented by providing the additional gate insulating layer 245.

A thin film transistor 13 according to another exemplary embodiment will now be described with reference to FIG. 14.

Figure 14:
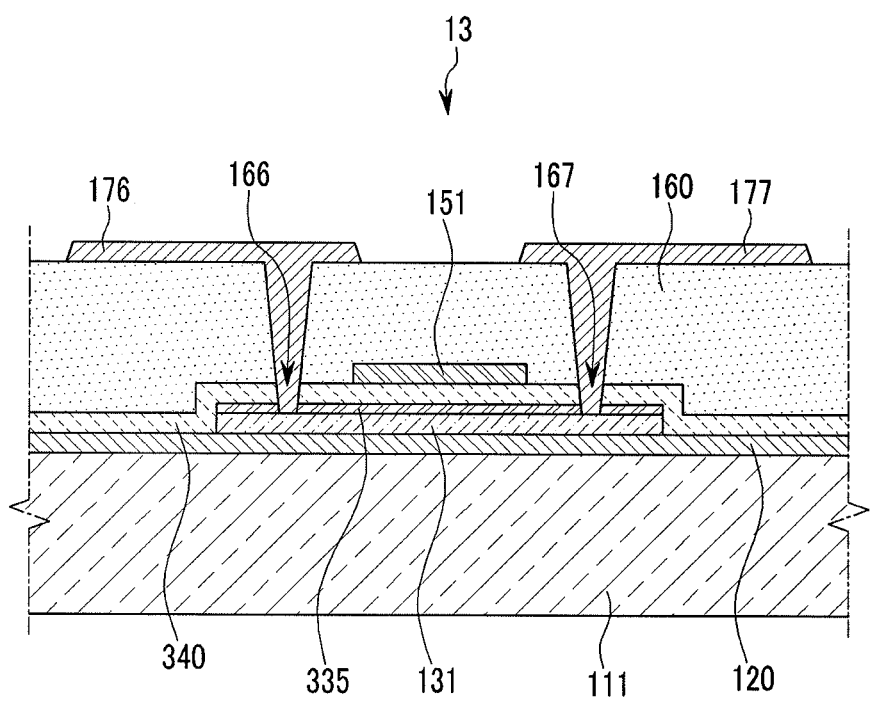
FIG. 14 illustrates a magnified cross-sectional view of a thin film transistor according to another exemplary embodiment.

As shown in FIG. 14, a buffer layer 120 may be formed on the substrate 111, and a semiconductor layer 131 that is crystallized by using a metal catalyst may be formed on the buffer layer 120. The metal catalyst may be used to crystallize the semiconductor layer 131, and some of the metal catalyst may remain in the crystallized semiconductor layer 131.

A getter layer 335 patterned with the semiconductor layer 131 may be formed on the semiconductor layer 131. The getter layer 335 may be formed with the same pattern as the semiconductor layer 131 except for the contact holes 166 and 167 to be described below. The getter layer 335 may be formed such that the getter layer 335 is not directly on the buffer layer 120. The getter layer 335 may contact the semiconductor layer 131.

The getter layer 335 may be formed with a metal oxide having a diffusion coefficient that is less than that of the metal catalyst in the semiconductor layer 131. The getter layer 335 may eliminate at least some of the metal catalyst remaining in the semiconductor layer 131. Further, the getter layer 335 formed with the metal oxide may have a thickness from several nm to several tens of nm, and may function as an insulator to support a gate insulating layer 340 to be described.

The gate insulating layer 340 may be formed on the getter layer 335. In the present exemplary embodiment, the gate insulating layer 340 may be formed to cover the semiconductor layer 131 and the getter layer 335 on the buffer layer 120.

A gate electrode 151 may be formed on the gate insulating layer 240. The gate electrode 151 may be disposed to overlap a region of the semiconductor layer 131.

An interlayer insulating layer 160 may be formed on the gate electrode 151. The interlayer insulating layer 160 may cover the gate electrode 151 on the getter layer 335.

Contact holes 166 and 167 extend through the interlayer insulating layer 160, the getter layer 335, and the gate insulating layer 340 to expose respective portions of the semiconductor layer 131.

A source electrode 176 and a drain electrode 177 contacting the semiconductor layer 131 may be formed on the interlayer insulating layer 160 through the contact holes 166 and 167. The source electrode 176 and the drain electrode 177 may be spaced apart from each other.

Through the above-described configuration, the thin film transistor 13 according to the present embodiment can have a semiconductor layer 131 that is quickly crystallized at a low temperature and from which the amount of remaining metal catalyst is further efficiently reduced by using the metal catalyst.

A method for manufacturing a thin film transistor 13 according to the present exemplary embodiment will now be described with reference to FIG. 15 and FIG. 16.

A buffer layer 120 may be formed on the substrate 111, and a metal catalyst may be scattered on the buffer layer 120 with a surface density from 1.0e12 atoms/cm² to 1.0e15 atoms/cm². For example, nickel may be used for the metal catalyst.

An amorphous silicon layer may be formed on the buffer layer 120, and a polysilicon layer may be formed by crystallizing the amorphous silicon layer by use of a metal catalyst. The metal catalyst used for crystallization may remain in the crystallized polysilicon layer.

A gettering metal layer may be formed on the polysilicon layer to contact the polysilicon layer. The gettering metal layer may be formed with a metal having a diffusion coefficient that is less than that of the metal catalyst in the polysilicon layer.

The gettering metal layer may be oxidized through the heat treatment process and the density of the metal catalyst included in the polysilicon layer may be reduced. At least part of the metal catalyst in the polysilicon layer may be removed. At least part of the metal catalyst remaining in the polysilicon layer because of the heat treatment may migrate to an area of the polysilicon layer touching the gettering metal layer. The metal catalyst that has migrated to the gettering metal layer may settle in the gettering metal layer and may no longer migrate. Hence, the metal catalyst remaining in the polysilicon layer may be gettered.

The gettering metal layer may be formed with a thickness from several nm to several tens of nm. When the gettering metal layer has a thickness that is less than several nm, it may be difficult to remove the metal catalyst. On the other hand, when the gettering metal layer has a thickness that is greater than several tens of nm, a thermal stress may occur during the heat treatment process.

Figure 15:
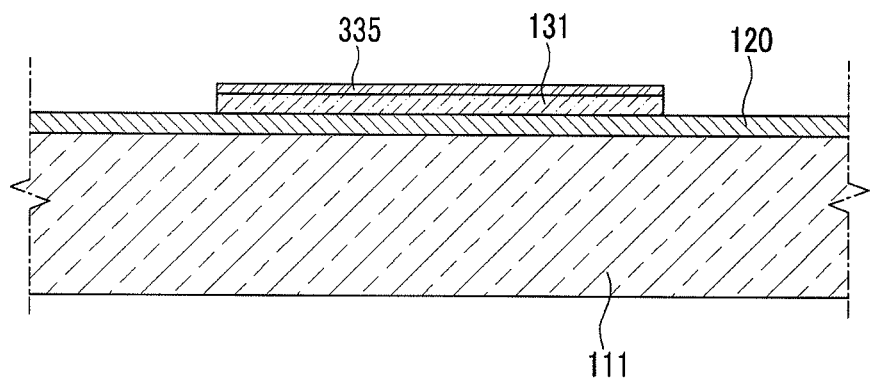
FIG. 15 and FIG. 16 illustrate sequential cross-sectional views of a manufacturing process for a thin film transistor as shown in FIG. 14.

As shown in FIG. 15, the polysilicon layer and the oxidized gettering metal layer may be patterned together to form the semiconductor layer 131 and the getter layer 235 in the same pattern.

Figure 16:
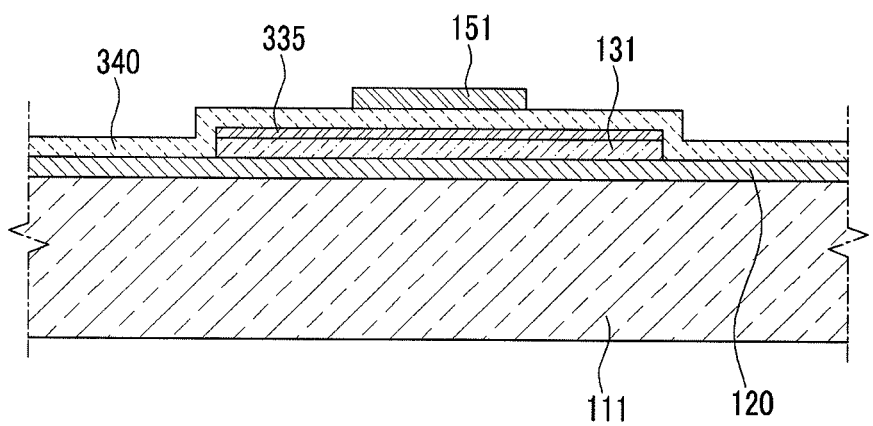

As shown in FIG. 16, a gate insulating layer 340 may be formed on the getter layer 335. The gate insulating layer 340 may be formed to cover the semiconductor layer 131 and the getter layer 335 on the buffer layer 120. A gate electrode 151 may be formed on the gate insulating layer 340.

As shown in FIG. 14, an interlayer insulating layer 160 that covers the gate electrode 151 may be formed. A source electrode 176 and a drain electrode 177 may be formed on the interlayer insulating layer 160. The source electrode 176 and the drain electrode 177 may be spaced apart from each other, and contact the semiconductor layer 131 through the contact holes 166 and 167.

Through the above-described manufacturing method, the thin film transistor 13 according to the present exemplary embodiment is manufactured. That is, the metal catalyst included in the semiconductor layer 131 can be more efficiently gettered.

Another exemplary embodiment will now be described referring to FIG. 17.

Figure 17:
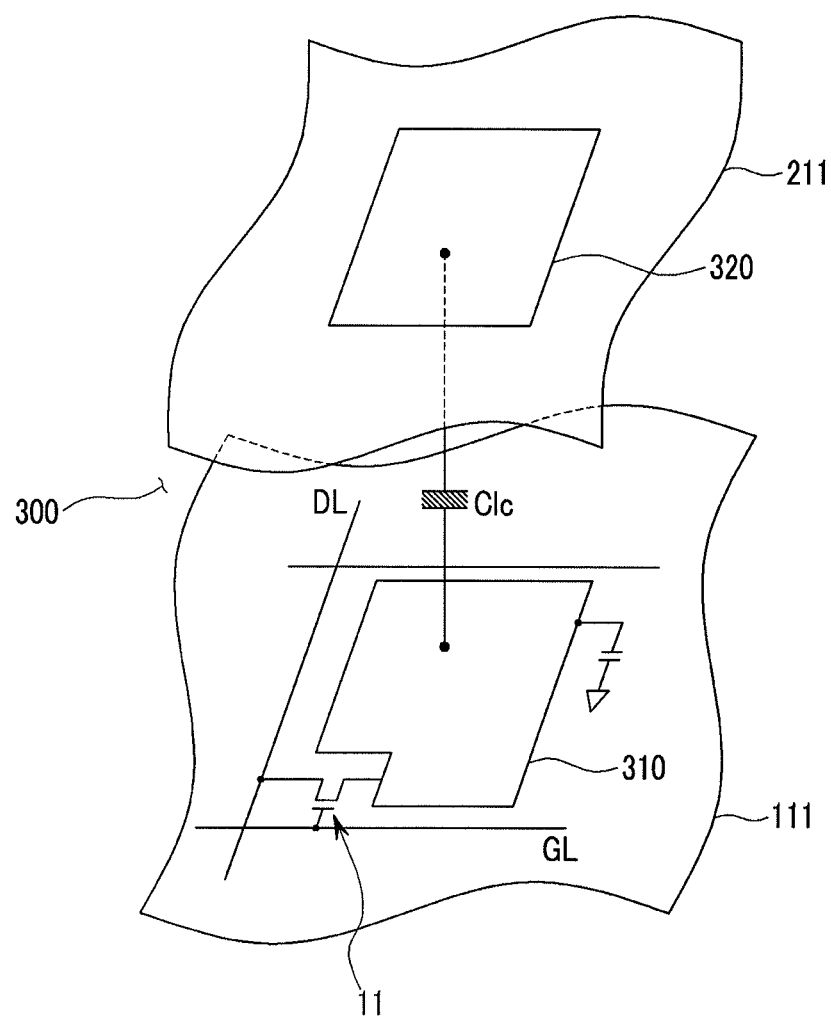
FIG. 17 illustrates an equivalent circuit of a pixel circuit of a display device according to another exemplary embodiment.

As shown in FIG. 17, a display device according to the present exemplary embodiment may include a liquid crystal layer 300 rather than the organic light emitting diode 70 shown in FIG. 2. In detail, the display device may include a pixel electrode 310 connected to a drain electrode of a thin film transistor 11, the liquid crystal layer 300 formed on the pixel electrode 310, and a common electrode 320 formed on the liquid crystal layer 300.

The thin film transistor may have the same configuration as at least one of the thin film transistors 11, 12, and 13 according to the exemplary embodiments described above.

The liquid crystal layer 300 may include various sorts of liquid crystal.

Also, the display device may further include a facing substrate 211 arranged opposite to the substrate 111 with the liquid crystal layer 300 therebetween. The common electrode 320 may be formed on the facing substrate 211.

The display device may further includes polarizing plates (not shown) attached to the substrate 111 and the facing substrate 211.

Further, the liquid crystal layer 300 and the facing substrate 211 are not restricted to the configuration shown in FIG. 17. The liquid crystal layer 300 and the facing substrate 211 may have various configurations within the range easily modifiable by the skilled person.

By way of summation and review, methods for crystallizing the amorphous silicon film to form an LTPS TFT may include a solid phase crystallization method, an excimer laser crystallization method, and a crystallization method using a metal catalyst. Also, metal-using crystallization methods may include a metal induced crystallization (MIC) method, a metal induced al crystallization (MILC) method, and a super grain silicon (SGS) crystallization method. From among them, the crystallization method using a metal catalyst has an advantage of quick crystallization at a low temperature.

The embodiments may circumvent the deterioration of an element characteristic of the thin film transistor because of metal catalyst remaining in the semiconductor layer in a crystallization method using a metal catalyst. Accordingly, when an amorphous silicon layer is crystallized by using the metal catalyst, an efficient gettering process for eliminating the metal catalyst is desirable.

The embodiments may provide a thin film transistor with a reduced amount of a metal catalyst remaining in a crystallized semiconductor layer.

The described embodiments may provide a thin film transistor manufacturing method in which a metal catalyst remaining in a semiconductor layer may be efficiently gettered.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor comprising:
    a substrate;
    a semiconductor layer provided on the substrate and crystallized by using a metal catalyst;
    a gate electrode insulated from and disposed on the semiconductor layer; and
    a getter layer disposed between the semiconductor layer and the gate electrode, and formed with a metal oxide having a diffusion coefficient that is less than a diffusion coefficient of the metal catalyst in the semiconductor layer.

2. The thin film transistor as claimed in claim 1, wherein the diffusion coefficient of the getter layer is greater than 0 less than $1/100$ of the diffusion coefficient of the metal catalyst.

3. The thin film transistor as claimed in claim 1, further including
    a buffer layer disposed between the substrate and the semiconductor layer, wherein
    the metal catalyst is scattered between the buffer layer and the semiconductor layer with a surface density in a range from $1.0e12$ atoms/cm$^2$ to $1.0e15$ atoms/cm$^2$.

4. The thin film transistor as claimed in claim 1, wherein the metal catalyst is scattered on the semiconductor layer with a surface density in a range from $1.0e12$ atoms/cm$^2$ to $1.0e15$ atoms/cm$^2$.

5. The thin film transistor as claimed in claim 1, wherein the metal catalyst includes at least one of nickel (Ni), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt).

6. The thin film transistor as claimed in claim 1, wherein the getter layer includes at least one of scandium (Sc), titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), ruthenium (Ru), osmium (Os), cobalt (Co), rhodium (Rh), iridium (Ir), platinum (Pt), yttrium (Y), lanthanum (La), germanium (Ge), praseodymium (Pr), neodymium (Nd), dysprosium (Dy), holmium (Ho), aluminum (Al), titanium nitride (TiN), and tantalum nitride (TaN), alloys thereof, or silicides thereof.

7. The thin film transistor as claimed in claim 1, further including
    a gate insulating layer disposed between the getter layer and the semiconductor layer.

8. The thin film transistor as claimed in claim 7, further including
    an interlayer insulating layer that covers the gate electrode, a source electrode formed on the interlayer insulating layer, and a drain electrode formed on the interlayer insulating layer and spaced apart from the source electrode.

9. The thin film transistor as claimed in claim 8, wherein
    a plurality of contact holes extend through the interlayer insulating layer, the getter layer, and the gate insulating layer to expose respective portions of the semiconductor layer, and
    the source electrode and the drain electrode contact the respective portions of the semiconductor layer through respective contact holes.

10. The thin film transistor as claimed in claim 1, further including
    a gate insulating layer disposed between the getter layer and the semiconductor layer, the gate insulating layer being patterned with the semiconductor layer, and
    wherein the getter layer contacts a side of the semiconductor layer.

11. The thin film transistor as claimed in claim 1, further including
    a gate insulating layer disposed between the getter layer and the gate electrode, and
    wherein the getter layer contacts the semiconductor layer and the getter layer and the semiconductor layer have a same pattern.

12. A display device comprising:
    a substrate;
    a semiconductor layer provided on the substrate and crystallized by using a metal catalyst;
    a gate electrode insulated from and disposed on the semiconductor layer;
    a getter layer disposed between the semiconductor layer and the gate electrode and formed with a metal oxide having a diffusion coefficient that is less than a diffusion coefficient of the metal catalyst in the semiconductor layer;
    a source electrode contacting a source region of the semiconductor layer and spaced apart from the gate electrode; and
    a drain electrode contacting a drain region of the semiconductor layer and spaced apart from the gate electrode and the source electrode.

13. The display device as claimed in claim 12, further including a gate insulating layer disposed between the getter layer and the semiconductor layer.

14. The display device as claimed in claim 13, further including
    an interlayer insulating layer that covers the gate electrode, wherein the source electrode is formed on the interlayer insulating layer, and the drain electrode is formed on the interlayer insulating layer and spaced apart from the source electrode.

15. The display device as claimed in claim 14, wherein
    a plurality of contact holes extend through the interlayer insulating layer, the getter layer, and the gate insulating layer to expose portions of the semiconductor layer, and
    the source electrode and the drain electrode contact the portions of the semiconductor layer through respective contact holes.

16. The display device as claimed in claim 12, further including
a gate insulating layer disposed between the getter layer and the semiconductor layer, the gate insulating layer being patterned in a same pattern as the semiconductor layer,
wherein the getter layer contacts a side of the semiconductor layer.

17. The display device as claimed in claim 12, further including
a gate insulating layer disposed between the getter layer and the gate electrode,
wherein the getter layer contacts the semiconductor layer and the getter layer and the semiconductor layer have a same pattern.

18. The display device as claimed in claim 12, further including
an organic light emitting diode connected to the drain electrode.

19. The display device as claimed in claim 12, further including
a pixel electrode connected to the drain electrode, a liquid crystal layer formed on the pixel electrode, and a common electrode formed on the liquid crystal layer.

20. A method for manufacturing a thin film transistor comprising:
providing a substrate;
forming an amorphous silicon layer on the substrate;
forming a polysilicon layer by crystallizing the amorphous silicon layer by use of a metal catalyst;
forming a semiconductor layer by patterning the polysilicon layer;
forming a gate insulating layer on the semiconductor layer;
forming a plurality of gettering holes on the gate insulating layer;
forming a gettering metal layer on the gate insulating layer to contact the semiconductor layer through the plurality of gettering holes; and
forming a getter layer while oxidizing the gettering metal layer through a heat treatment process, such that the getter layer is formed with a metal oxide having a diffusion coefficient that is less than a diffusion coefficient of the metal catalyst included in the semiconductor layer, and reducing a density of metal catalyst included in the semiconductor layer.

21. The method as claimed in claim 20, further including:
forming a gate electrode on the getter layer so as to overlap a region of the semiconductor layer;
forming an interlayer insulating layer that covers the gate electrode;
forming a plurality of contact holes penetrating the interlayer insulating layer, the getter layer, and the gate insulating layer and exposing source and drain portions of the semiconductor layer; and
forming a source electrode and a drain electrode on the interlayer insulating layer to contact the semiconductor layer through respective ones of the plurality of contact holes.

22. The method as claimed in claim 21, wherein the plurality of contact holes overlap the plurality of gettering holes.

23. The method as claimed in claim 22, wherein
when the plurality of contact holes are formed, portions of the getter layer contacting the semiconductor layer through the plurality of gettering holes are eliminated.

24. A method for manufacturing a thin film transistor comprising:
providing a substrate;
forming an amorphous silicon layer on the substrate;
forming a polysilicon layer by crystallizing the amorphous silicon layer by use of a metal catalyst;
coating an insulation material on the polysilicon layer;
forming a semiconductor layer and a gate insulating layer in the same pattern by patterning the polysilicon layer and the insulation material;
forming a gettering metal layer on the gate insulating layer to contact a side of the semiconductor layer; and
forming a getter layer by oxidizing the gettering metal layer through a heat treatment process such that the getter layer is formed with a metal oxide having a diffusion coefficient that is less than a diffusion coefficient of the metal catalyst included in the semiconductor layer, and reducing a density of metal catalyst included in the semiconductor layer.

25. A method for manufacturing a thin film transistor comprising:
providing a substrate;
forming an amorphous silicon layer on the substrate;
forming a polysilicon layer by crystallizing the amorphous silicon layer by use of a metal catalyst, the polysilicon layer including a residual amount of the metal catalyst;
forming a gettering metal layer on the polysilicon layer;
oxidizing the gettering metal layer through a heat treatment process, and reducing a density of the metal catalyst included in the polysilicon layer;
forming a semiconductor layer and a getter layer in the same pattern by patterning the polysilicon layer and the oxidized gettering metal layer; and
forming a gate insulating layer on the getter layer, wherein the getter layer is formed with a metal oxide having a diffusion coefficient that is less than a diffusion coefficient of the metal catalyst in the semiconductor layer.

26. The method as claimed in claim 25, wherein the diffusion coefficient of the getter layer is greater than 0 and less than 1/100 of the diffusion coefficient of the metal catalyst.

27. The method as claimed in claim 25, further including
forming a buffer layer between the substrate and the amorphous silicon layer, wherein
the metal catalyst is scattered between the buffer layer and the amorphous silicon layer with a surface density in a range from 1.0e12 atoms/cm$^2$ to 1.0e15 atoms/cm$^2$.

28. The method as claimed in claim 25, wherein
the metal catalyst is scattered on the amorphous silicon layer with a surface density in a range from 1.0e12 atoms/cm$^2$ to 1.0e15 atoms/cm$^2$.

29. The method as claimed in claim 25, wherein
the metal catalyst includes at least one of nickel (Ni), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt).

30. The method as claimed in claim 25, wherein
the getter layer includes at least one of scandium (Sc), titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), ruthenium (Ru), osmium (Os), cobalt (Co), rhodium (Rh), iridium (Ir), platinum (Pt), yttrium (Y), lanthanum (La), germanium (Ge), praseodymium (Pr), neodymium (Nd), dysprosium (Dy), holmium (Ho), aluminum (Al), titanium nitride (TiN), and tantalum nitride (TaN), alloys thereof, or silicides thereof.

31. The method as claimed in claim 26, wherein
the heat treatment process is performed at a temperature from 400 to 993 degrees Celsius.

* * * * *